(12) United States Patent
Etienne-Cummings et al.

(10) Patent No.: US 8,346,841 B2
(45) Date of Patent: Jan. 1, 2013

(54) CROSS-CORRELATION OF SIGNALS USING EVENT-BASED SAMPLING

(75) Inventors: Ralph R. Etienne-Cummings, Baltimore, MD (US); Jonathan Craig Tapson, Cape Town (ZA); Francesco V. G. Tenore, Baltimore, MD (US); Fopefulu O. Folowosele, Baltimore, MD (US); Mark Philip Vismer, Harston (GB)

(73) Assignee: The University of Cape Town Research Contracts and Intellectual Property Services (ZA)

( * ) Notice: Subject to any disclaimer, the term of this patent is extended or adjusted under 35 U.S.C. 154(b) by 898 days.

(21) Appl. No.: 12/467,759

(22) Filed: May 18, 2009

(65) Prior Publication Data
US 2009/0284294 A1    Nov. 19, 2009

Related U.S. Application Data

(60) Provisional application No. 61/127,841, filed on May 16, 2008.

(51) Int. Cl.
*G06G 7/12* (2006.01)

(52) U.S. Cl. ........................................................ 708/813
(58) Field of Classification Search ................... 708/813
See application file for complete search history.

(56) References Cited

U.S. PATENT DOCUMENTS 3,517,879 A * 6/1970 Conway ...................... 708/422
4,329,687 A * 5/1982 Kloevekorn et al. ......... 342/136

FOREIGN PATENT DOCUMENTS

GB        2189969 A * 11/1987

* cited by examiner

*Primary Examiner* — Tan V. Mai
(74) *Attorney, Agent, or Firm* — Fitch Even Tabin & Flannery LLP

(57) ABSTRACT

A sub-circuit for facilitating the synchronization of event-based samples of signals in a cross-correlation circuit utilizing event-based sampling is provided. The sub-circuit alternatively integrates one of the signals to be cross-correlated and alternates between the signals in response to the output of a hysteretic comparator. The invention extends to a method of manipulating the input signals to a cross-correlation circuit utilizing event-based sampling so-as to facilitate the synchronization of the event-based samples of the signals.

12 Claims, 2 Drawing Sheets

CROSS-CORRELATION OF SIGNALS USING EVENT-BASED SAMPLING

The U.S. Government has a paid-up license in this invention and the right in limited circumstances to require the patent owner to license others on reasonable terms as provided for by the terms of Grant No. EEC 9731478 and Award No. 0440217, awarded by the National Science Foundation (NSF), and by the terms of Contract No. 9080 awarded by the Defense Advanced Research Projects Agency (DARPA).

FIELD OF THE INVENTION

This invention relates to the cross-correlation of signals. In particular, but not exclusively, the invention relates to the synchronization of signals in cross-correlation circuits employing event-based or integrative sampling. The invention further relates to a method of synchronizing event-based samples of signals in a cross-correlation system employing event-based or integrative sampling.

BACKGROUND TO THE INVENTION

Cross correlation is a mathematical operation in which two signals (in the time domain) are compared with one another, usually over a fixed length of each signal. The comparison returns a third signal, which is normally the magnitude of the similarity between the two signals, at various delays between the two signals. This is expressed mathematically as:

$$R_{fg}(\tau) = \int_{-T/2}^{T/2} f(t)g(t+\tau)dt \qquad (1)$$

where $R_{fg}(\tau)$ is the cross-correlation function at delay $\tau$ for the two signals f(t) and g(t) evaluated over the time interval $-T/2$ to $T/2$.

Cross-correlation is extremely important in modern telecommunications systems, mainly due it being a key operation in a class of modulation systems called Code-Division Multiple Access (CDMA) systems. CDMA systems make very efficient use of the available telecommunications spectra, and are therefore at the time of this application the first choice in most wireless data systems, including GSM (Global System for Mobile communication), HSDPA (High-speed Download Packet Access) and various other widely used mobile data networks. The principles of CDMA are also used, in somewhat different form, in GNSS (Global Navigation Satellite Systems) networks such as the GPS (Global Positioning System) network and the GLONASS (Global Navigation Satellite System) network.

The signals transmitted over a CDMA system are encoded before transmission, in such a way as to spread their energy over a wider spectral bandwidth than that used by the raw signal. This improves their noise immunity and allows several signals to share the same spectral band. At the core of all CDMA receivers is a processing system that must cross-correlate the encoded incoming signals with local copies of the codes which were used to encode the transmission. This cross-correlation is effectively the decoding operation, Cross-correlating an encoded signal with the original code used to encode it reveals the original raw signal. Cross-correlation is therefore an essential operation in all CDMA systems.

Conventional cross-correlation is, however, a computationally intensive operation, particularly in mobile systems, and according consumes large amounts of energy, a valuable commodity in most mobile devices. Moving transmitters or receivers send or receive Doppler-shifted signals (these are signals whose frequencies are altered by the relative motion between transmitter and receiver). The demodulation (decoding) of the signal will not work if only one of the two signals to be correlated has a significant Doppler shift. It therefore becomes necessary to run several cross-correlations in parallel, using a variety of artificially Doppler-shifted versions of the local code. This is particularly a problem in GPS systems. A typical GPS system may need to decode with respect to 32 codes, and with up to 20 Doppler shifted variants of each code, meaning that over 600 correlation operations, must run in parallel. This is a core reason why integration of GPS systems into mobile phones, for example, has been slow: the GPS receivers consume a large amount of power.

It has been estimated that up to 40% of the power usage in a handheld GPS device can be attributed to cross-correlation operations.

The standard approach to cross-correlation is digital signal processing (DSP). The incoming signal is sampled (digitized) and stored in memory. The cross-correlation is then calculated mathematically and numerically. Such calculations are typically slow, intrinsically serial in nature, and consume a large amount of power.

Neuromorphic systems are engineering systems that are based on biological neural principles. They endeavor to copy the successful methods which have evolved in living organisms. Living organisms make a great deal of use of cross-correlation. For example, to estimate the motion of an object which is seen in the visual field, or to estimate the position from where sound originates, requires cross-correlation of visual or auditory signals.

Insect eyes, which consist of multiple individual segments, have already been copied to develop a useful electronic cross-correlator. They have an intrinsic pixel-by-pixel structure which translates well into digital systems. The technology is called a RAKE array and forms the basis of some commercially available GPS receivers.

Mammalian vision and auditory systems do not use the same approach as insects. It is not yet known how they cross-correlate, but structures equivalent to the insect systems have been searched for and, to the best of the applicant's knowledge, have not been found.

A model for mammalian cross-correlation which makes use of neural structures called half-center oscillators, which are widespread in the mammalian nervous system, has been proposed.

One advantage of this approach is that it is extremely robust to noise. Mammalian neural systems make use of very low electrical potential levels, and have chemical transmission paths that are inherently stochastic. This means that any system used in mammals will be intrinsically robust to noise. This advantage is one of the keys to the neuromorphic engineering approach. There has been a consistent trend towards the use of lower voltages in integrated circuits, as lower voltage circuits require less power. However, as the voltages get lower, the role of noise in circuits becomes more significant. The neuromorphic approach is that, instead of trying to mitigate noise, one should start with a process that is inherently robust to noise, and that such processes can be found in biological systems.

The basis of the present invention lies in the method of sampling the signal. In conventional signal processing, a time series is created from an analog signal by quantizing (measuring) the signal at evenly distributed times; the separation of the times is referred to as the sampling rate. If the signal is sampled at a sufficiently high sampling rate, and with sufficient accuracy in amplitude, then the resulting time series is considered to be an accurate representation of the original signal. This is the basic operation with which most digital signal processing starts.

An alternative way of sampling a signal is referred to as event-based or integral sampling. In event-based sampling, the analog signal is fed into an integrator circuit, which integrates the signal as well as associated noise. The slope of the output of the integrator can be altered by also adding a constant, or drift, term. Mathematically the integrator output is defined as follows:

$$v(\tau) = \int_{t_0}^{t_0+\tau} m + \sigma + g(t) \, dt \quad (2)$$

where $\tau$ is the interval since the start of integration, $v(\tau)$ is the integrator output voltage, m is the drift term, $\sigma$ is a noise parameter (for example, the standard deviation of some additive Gaussian white noise), and g(t) is the signal.

When this integrated signal reaches some predefined threshold voltage $\theta$, the integrator is reset to zero and a new integration interval begins. This event is often referred to as "firing" or "spiking".

The information generated by this process is a sequence of firing times $t_0, t_1, \ldots t_n$. It has been shown that if the system is appropriately set up, this sequence of times represents the analog input signal without a loss of information. Whereas the conventional sampling process converts the analog signal into a series of varying amplitudes at fixed times (a time series), event-based sampling (also referred to as integrate-and-fire sampling) converts the signal into a series of fixed events at varying times (this is referred to as an event series).

The mathematical cross-correlation expressed in Eq. 1 above is straightforward to implement if the two signals to be cross-correlated are available as two time series. To cross-correlate the information in event series form is more difficult because, while two times series which are sampled on the same time basis are intrinsically synchronized, the same cannot be said for two event series. The basis of event-based sampling is that the time of the event encodes the signal, so it is not possible to synchronize the times without somehow altering the information.

OBJECT OF THE INVENTION

It is an object of this invention to provide a sub-circuit and method useful for synchronizing event-based samples of signals to be cross-correlated in a cross-correlation circuit utilizing event-based sampling, which will at least partially alleviate some of the abovementioned problems.

SUMMARY OF THE INVENTION

In accordance with this invention there is provided a synchronization sub-circuit for a cross-correlation circuit utilizing event-based sampling, comprising
  a switch having first and second input terminals for receiving first and second input signals to be cross-correlated, a control terminal and an output terminal;
  an integrator having an input terminal connected to the output terminal of the switch, and an output terminal providing an output signal; and
  a hysteretic comparator having an input terminal connected to the output terminal of the integrator, and an output terminal providing an output signal that switches between a first state and a second state in response to the output signal of the integrator, and wherein the output terminal of the hysteretic comparator is connected to the control terminal of the switch causing the switch to alternately relay the first and the second signals to the integrator input terminal with an alternation occurring in response to each transition of the output signal of the hysteretic comparator between the first and the second state.

Further features of the invention provide for the integrator to be an operational amplifier having a capacitor connected between a negative input terminal and an output terminal thereof; for the hysteretic comparator to be a Schmidt trigger; and for the hysteretic comparator to define a higher and a lower threshold value.

Still further features of the invention provide for the first and second input signals to include drift terms causing the integrator to integrate in opposite directions, depending on which of the first and second input signals are being integrated; for the drift term associated with the first input signal to cause the integrator to integrate upwards in the direction of positive voltage when the first input signal is being integrated and for the drift term associated with the second input signal to cause the integrator to integrate downwards in the direction of negative voltage when the second input signal is being integrated; for the switch to relay the first input signal to the integrator when the output signal of the comparator is in the first state and the second input signal when the output of the comparator is in the second state; and for the output signal of the comparator to change from the first state to the second state when the integrator output signal rises above the higher threshold and from the second state to the first state when the integrator output drops below the lower threshold.

In accordance with a further aspect of this invention there is provided a method of manipulating two input signals to a cross-correlation circuit utilizing event-based sampling, comprising the steps of
  relaying a first of the two input signals to an integrator when a control signal is in a first state;
  integrating the first input signal in a direction of positive voltage when the control signal is in the first state;
  relaying a second of the two input signals to the integrator when the control signal is in a second state;
  integrating the second input signal in a direction of negative voltage when the control signal is in the second state;
  changing the control signal from the first state to the second state when an output of the integrator rises above a higher threshold value; and
  changing the control signal from the second state to the first state when the output of the integrator drops below a lower threshold value.

Further features of the invention provide for the method to include the steps of adding a first drift term to the first input signal causing the integrator to integrate in the direction of positive voltage when the first input signal is being integrated; adding a second drift term to the second input signal causing the integrator to integrate in the direction of negative voltage when the second input voltage is being integrated; and connecting the output of the integrator to a Schmidt trigger defining the higher and lower threshold values and the output of which provides the control signal.

In accordance with a still further aspect of this invention there is provided a method of manipulating two input signals to a cross-correlation circuit utilizing event-based sampling, comprising the steps of integrating a first of the two input signals in a direction of positive voltage while a control signal remains in a first state;

integrating a second of the two input signals in a direction of negative voltage while the control signal remains in a second state;

switching the control signal from the first state to the second state when a result of the integration rises above a higher predetermined threshold while the control signal is in the first state; and switching the control signal from the second to the first state when the result of the integration drops below a lower predetermined threshold while the control signal is in the second state.

BRIEF DESCRIPTION OF THE DRAWINGS

The invention will now be described, by way of example only with reference to the accompanying representations in which.

DETAILED DESCRIPTION WITH REFERENCE TO THE DRAWINGS

Figure 1:
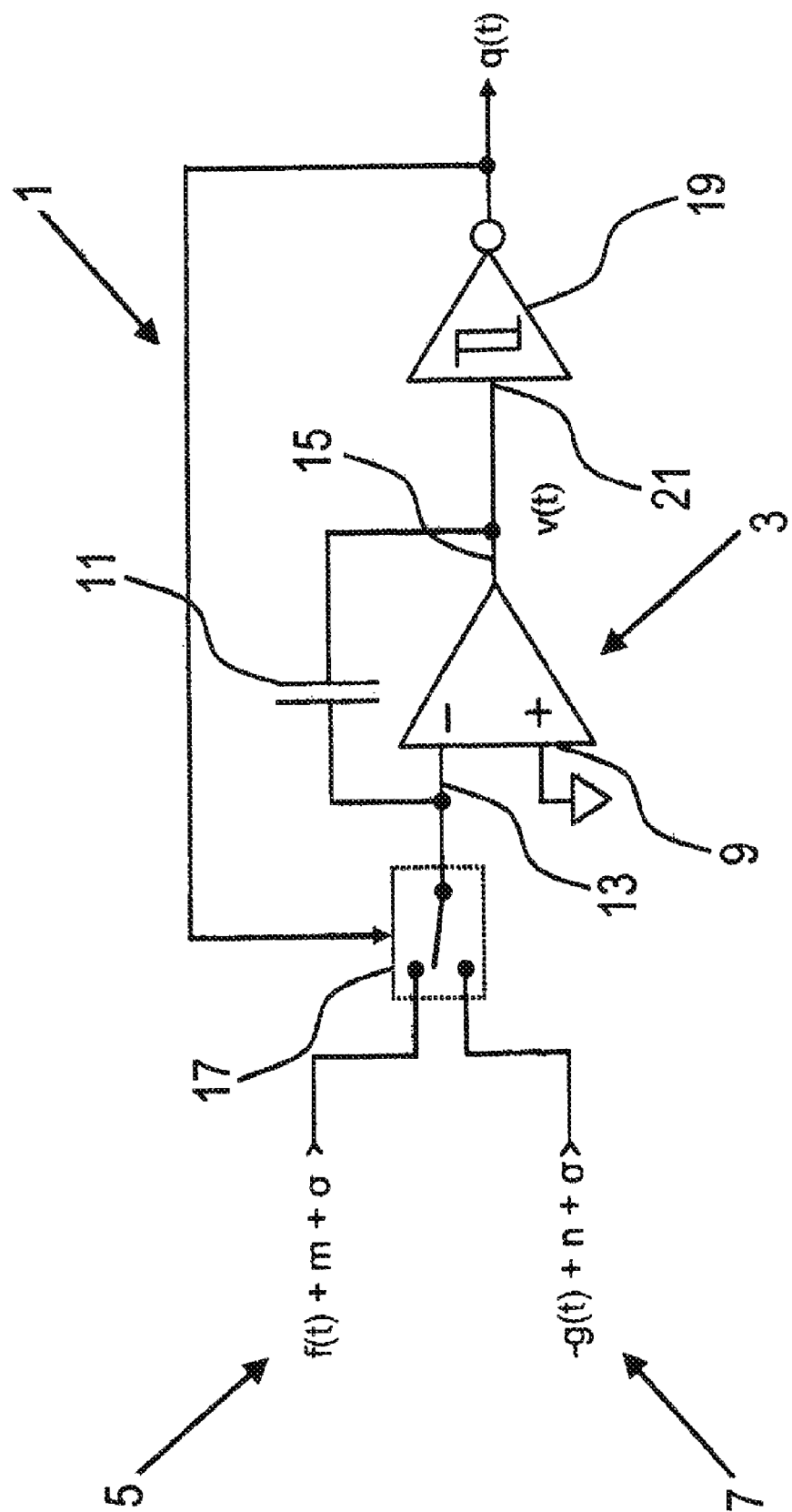
FIG. 1 is a schematic circuit diagram of a synchronization sub-circuit in accordance with the invention.

A sub-circuit (1) in accordance with the invention is shown in FIG. 1 and includes an integrator (3) which is set up to integrate two different combination input signals (5 and 7) by sequentially switching between them.

The integrator (3) is formed in a conventional way by means of an operational amplifier (9) having a capacitor (11) connected between its negative input terminal (13) and output terminal (15). The input signals (5 and 7) to the integrator (3) are fed in through a switch (17) which selects either one of the two combination input signals (5 and 7) to be relayed to the integrator (3). The selection is controlled by the output of a hysteretic comparator (19), in this example an inverting Schmitt trigger. The first of the input signals (5) consists of f(t) (a signal to be cross correlated with g(t) as in Eq. 1 above) combined with a drift term m and some noise σ. The second input signal (7) consists of −g(t) (the negative of g(t)) combined with a different drift term n and noise σ. The noise may be different or identical for both combination input signals (5 and 7).

For the purpose of this description it is assumed that f(t) and g(t) both have a zero mean value, as is usual in this type of signal processing; although that is by no means necessary for the circuit to function correctly. The drift terms m and n are chosen and implemented to cause the integrator (3) to integrate in opposite directions, so that for m the integrator (3) integrates upward (in the direction of positive voltage polarity) and for n the integrator (3) integrates downward (in the direction of negative polarity).

The output v(t) of the integrator (3) is fed into the input terminal (21) of the inverting Schmitt trigger P (19). A Schmitt trigger, or hysteretic comparator, is a well-known circuit element. It defines two threshold levels separated by a hysteresis gap or band. At any moment, one of the threshold levels, either higher or lower, is in operation. If the higher threshold is in operation, the output of the Schmitt trigger will change state when the input exceeds the higher threshold level. At that time, the comparator will switch to using the other, lower, threshold level. The output will not change state again until the input traverses below the lower threshold, at which time the threshold in operation will change back to the higher level.

Figure 2:
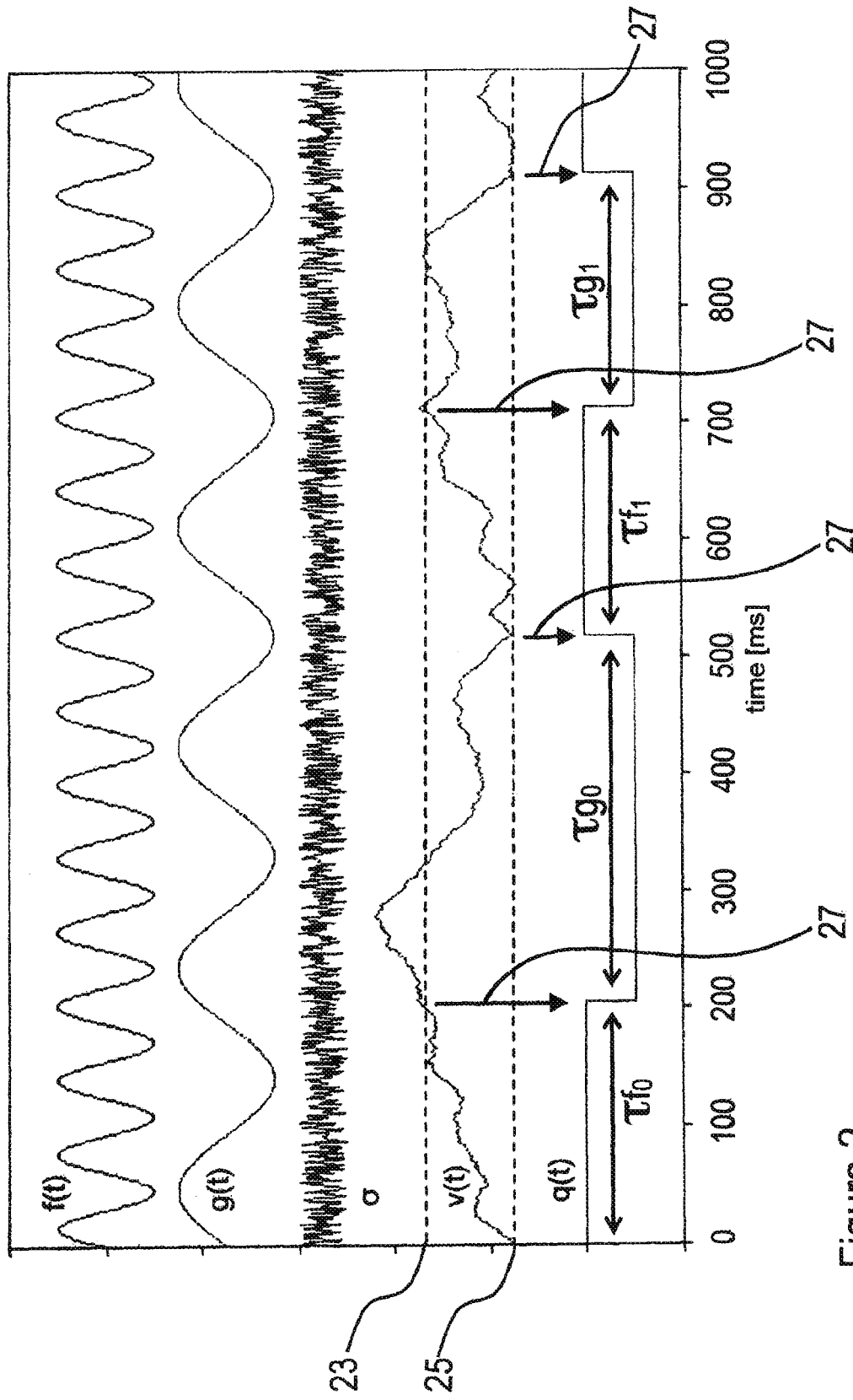
FIG. 2 is a timing diagram exemplifying the signals obtained at various positions in the sub-circuit of FIG. 1.

The invention is further described by means of example signals in FIG. 2. The signals are vertically separated for clarity and shows the first input signal f(t) to be cross-correlated, the second input signal to be cross-correlated g(t), the noise signal σ, the integrator output signal v(t), and the Schmitt trigger output signal q(t). The two thresholds for the Schmitt trigger are indicated by the horizontal dotted lines (23 and 25). It can be seen that the integrator integrates upwards in the direction of positive voltage, integrating the first combination input signal (5) (f(t)+m +σ), until the higher threshold (23) of the Schmidt trigger (19) is reached at approximately 200 ms. At that point, the Schmidt trigger (19) changes state, as is evident from its output q(t), and the input is switched to integrate the second combination input signal (7) (−g(t)+n+σ). The second signal (7) is then integrated downwards (in the direction of negative voltage) until the lower threshold (25) of the Schmidt trigger (19) is transitioned at about time 520 ms. At that point the switch (17) again switches to the first input signal (5) and the process then repeats itself, with further transition events as indicated by the arrows (27).

The working of the sub-circuit (1) depends on the fact that the start point of the integration of one signal is triggered by the end point of the integration of the other. In other words, the precise event in one signal stream triggers the start of sampling of the next event in the other. This has the effect of synchronizing the event-based sampling of the two signals, in a way that is appropriate for further cross-correlating.

It should be noted that in the absence of noise, it is foreseeable that the integrations would become phase-locked to a strong input signal such as those shown in FIG. 2. The noise serves to scatter the sampling through a larger range of times It has been found that the sub-circuit's performance improves up to a certain level with added noise, after which it deteriorates. In this respect its behavior is similar to the physical phenomenon known as stochastic resonance. In certain cases it is even foreseeable that a certain level of noise may be added to the input signals. The noise may be added to the signals as indicated in FIG. 2 or, alternatively, at any suitable location in the circuit.

At this stage it should be noted that the input series used for the cross-correlation of the signals are the series of intervals between events (27), as indicated by the labels $\tau f_i$ and $\tau g_i$ in FIG. 2, where i is an integer number (0, 1, 2, . . . ). It should be appreciated that these intervals form two separate series that may be processed separately. The process is simple; the intervals are simply histogrammed or binned, i.e. a histogram is developed in which the height of a column for interval x is the number of intervals for which the length was x. The histogram for the series $\tau f_i$ above will have the shape represented by the following equation:

$$H_{\tau f_i}(\tau) = K\left[\frac{\theta}{\sqrt{2\pi\sigma^2\tau^3}}\exp\left(-\frac{(\theta - m\tau)^2}{2\sigma^2\tau}\right)\right]R_{fg}(\tau) \qquad (3)$$

where K is a scaling factor which depends on the number of intervals accumulated, θ is the potential difference between thresholds, and all other symbols have their meaning as before. The desired cross-correlation function $R_{fg}(\tau)$ may be established by simply dividing the histogram by the expression in square brackets in equation (3) above. Similarly, the histogram for the series $\tau g_i$ may have the shape represented by the following equation:

$$H_{\tau g_i}(\tau) = K\left[\frac{\theta}{\sqrt{2\pi\sigma^2\tau^3}}\exp\left(-\frac{(\theta-n\tau)^2}{2\sigma^2\tau}\right)\right]R_{gf}(\tau) \quad (4)$$

The sub-circuit (1) of the invention described above may therefore be used as a fundamental building block in cross-correlation circuits which make use of event-based or integrative sampling. It should be noted that the sub-circuit (1) intrinsically synchronizes the event-based samples for the two input signals; it produces as an output a set of intervals which can easily be post-processed into histograms which show the cross-correlation function which is required; and its operation is not significantly affected by the presence of noise and in fact is improved by moderate levels of noise. It is therefore more suitable than conventional circuits for low-noise electronics.

Numerous modifications may be made to the embodiment of the invention described above without departing from the scope of the invention. In particular, the circuit elements such as the switch, integrator and comparator may be replaced with alternative components providing similar functionality.

The invention claimed is:

1. A synchronization sub-circuit for a cross-correlation circuit utilizing event-based sampling, comprising
   a switch having first and second input terminals for receiving first and second input signals to be cross-correlated, a control terminal and an output terminal;
   an integrator having an input terminal connected to the output terminal of the switch, and an output terminal providing an output signal; and
   a hysteretic comparator having an input terminal connected to the output terminal of the integrator, and an output terminal providing an output signal that switches between a first state and a second state in response to the output signal of the integrator, and wherein the output terminal of the hysteretic comparator is connected to the control terminal of the switch causing the switch to alternately relay the first and the second signals to the integrator input terminal with an alternation occurring in response to each transition of the output signal of the hysteretic comparator between the first and the second state.

2. A synchronization sub-circuit as claimed in claim 1 in which the integrator is an operational amplifier having a capacitor connected between a negative input terminal and an output terminal thereof.

3. A synchronization sub-circuit as claimed in claim 1 in which the hysteretic comparator is a Schmidt trigger.

4. A synchronization sub-circuit as claimed in claim 1 in which the first and second input signals include drift terms causing the integrator to integrate in opposite directions, depending on which of the first and second input signals are being integrated.

5. A synchronization sub-circuit as claimed in claim 4 in which the drift term associated with the first input signal causes the integrator to integrate upwards in the direction of positive voltage when the first input signal is being integrated and for the drift term associated with the second input signal to cause the integrator to integrate downwards in the direction of negative voltage when the second input signal is being integrated.

6. A synchronization sub-circuit as claimed in claim 1 in which the switch relays the first input signal to the integrator when the output signal of the comparator is in the first state and the second input signal when the output of the comparator is in the second state.

7. A synchronization sub-circuit as claimed in claim 6 in which the hysteretic comparator defines a higher and a lower threshold value.

8. A synchronization sub-circuit as claimed in claim 7 in which the output signal of the comparator changes from the first state to the second state when the integrator output signal rises above the higher threshold and from the second state to the first state when the integrator output drops below the lower threshold.

9. A method of manipulating two input signals to a cross-correlation circuit utilizing event-based sampling, comprising the steps of
   relaying a first of the two input signals to an integrator when a control signal is in a first state;
     integrating the first input signal in a direction of positive voltage when the control signal is in the first state;
     relaying a second of the two input signals to the integrator when the control signal is in a second state;
     integrating the second input signal in a direction of negative voltage when the control signal is in the second state;
     changing the control signal from the first state to the second state when an output of the integrator rises above a higher threshold value; and
     changing the control signal from the second state to the first state when the output of the integrator drops below a lower threshold value.

10. A method as claimed in claim 9 including the steps of adding a first drift term to the first input signal causing the integrator to integrate in the direction of positive voltage when the first input signal is being integrated and adding a second drift term to the second input signal causing the integrator to integrate in the direction of negative voltage when the second input signal is being integrated.

11. A method as claimed in claim 10 including the step of connecting the output of the integrator to a Schmidt trigger defining the higher and lower threshold values and the output of which provides the control signal.

12. A method of manipulating two input signals to a cross-correlation circuit utilizing event-based sampling, comprising the steps of
   integrating a first of the two input signals in a direction of positive voltage while a control signal remains in a first state;
   integrating a second of the two input signals in a direction of negative voltage while the control signal remains in a second state;
   switching the control signal from the first state to the second state when a result of the integration rises above a higher predetermined threshold while the control signal is in the first state; and
   switching the control signal from the second to the first state when the result of the integration drops below a lower predetermined threshold while the control signal is in the second state.

* * * * *